United States Patent
Joo

(10) Patent No.: US 9,213,592 B2
(45) Date of Patent: Dec. 15, 2015

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Seok Jin Joo, Seoul (KR)

(73) Assignee: SK HYNIX INC., Icheon-Si, Gyeonggi-Do (KR)

( * ) Notice: Subject to any disclaimer, the term of this patent is extended or adjusted under 35 U.S.C. 154(b) by 107 days.

(21) Appl. No.: 13/719,212

(22) Filed: Dec. 18, 2012

(65) Prior Publication Data

US 2014/0068377 A1    Mar. 6, 2014

(30) Foreign Application Priority Data

Aug. 30, 2012  (KR) .................. 10-2012-0095695

(51) Int. Cl.
  *G06F 11/10* (2006.01)
  *G11C 16/34* (2006.01)
  *G11C 29/04* (2006.01)

(52) U.S. Cl.
  CPC ........ *G06F 11/1008* (2013.01); *G06F 11/1048* (2013.01); *G11C 16/349* (2013.01); *G11C 2029/0411* (2013.01)

(58) Field of Classification Search
  CPC ............ G06F 11/1008; G06F 11/1048; G11C 2029/0411; G11C 16/349
  USPC ........................................ 714/764
  See application file for complete search history.

(56) References Cited

U.S. PATENT DOCUMENTS

| | | | | |
|---|---|---|---|---|
| 6,631,488 B1* | 10/2003 | Stambaugh et al. | .......... | 714/746 |
| 7,730,379 B2* | 6/2010 | Chen | ............... | 714/755 |
| 7,765,426 B2* | 7/2010 | Li | ................ | 714/6.13 |
| 2011/0228604 A1* | 9/2011 | Eli et al. | .................. | 365/185.09 |
| 2011/0320915 A1* | 12/2011 | Khan | .............. | 714/773 |
| 2012/0060056 A1* | 3/2012 | Lee et al. | .......... | 714/15 |
| 2012/0110417 A1* | 5/2012 | D'Abreu et al. | .............. | 714/773 |
| 2012/0240011 A1* | 9/2012 | Helm et al. | ................... | 714/773 |
| 2013/0073924 A1* | 3/2013 | D'Abreu et al. | ............ | 714/763 |
| 2013/0094288 A1* | 4/2013 | Patapoutian et al. | ..... | 365/185.03 |
| 2013/0139036 A1* | 5/2013 | Lee | ................ | 714/773 |
| 2013/0166986 A1* | 6/2013 | Alrod et al. | .................. | 714/755 |

FOREIGN PATENT DOCUMENTS

KR  1020010103582 A  11/2001
KR  1020040071574 A  8/2004

* cited by examiner

*Primary Examiner* — Sam Rizk
*Assistant Examiner* — Kyle Vallecillo
(74) *Attorney, Agent, or Firm* — Haynes and Boone, LLP

(57) ABSTRACT

Semiconductor memory device and method of operating same includes reading data stored in memory cells of a page; performing an error correction loop (ECC loop) including performing an error checking and correcting operation (ECC) on the read data; determining a number of bit errors in the read data; and when the number of bit errors is greater than a maximum number of correctable bits, incrementing the number of ECC iterations (ECC count) and increasing the maximum number of correctable bits; storing the ECC count until the number of bit errors is less than the maximum number of correctable bits; and programming corrected data to the memory cells when the stored ECC count is more than preset number.

21 Claims, 5 Drawing Sheets

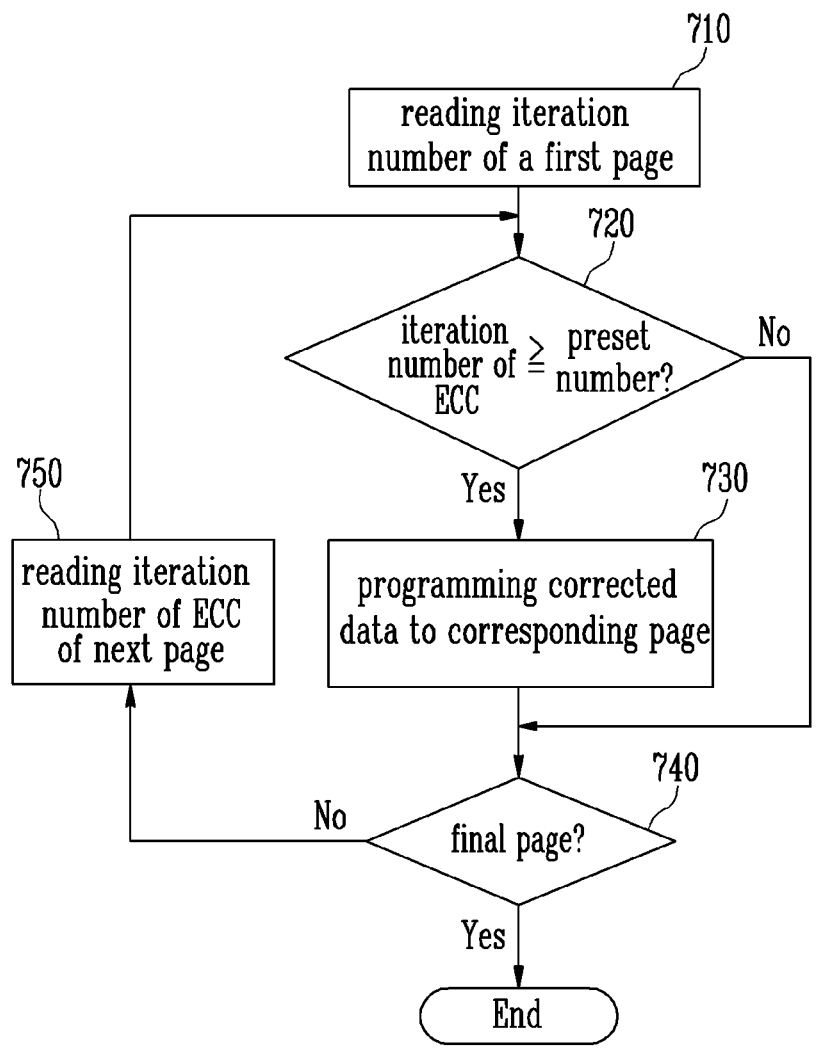

SEMICONDUCTOR MEMORY DEVICE AND METHOD OF OPERATING THE SAME

CROSS-REFERENCE TO RELATED APPLICATION

This application claims priority from Korean Patent Application No. 10-2012-0095695, filed on Aug. 30, 2012, the contents of which are incorporated herein by reference in its entirety.

BACKGROUND

The present invention relates to a semiconductor memory device and a method of operating the same, and more particularly relates to a semiconductor memory device for enhancing retention characteristics of data and a method of operating the same.

A semiconductor memory may include memory devices embodied by using a semiconductor such as silicon Si, germanium Ge, gallium arsenide GaAs, indium phosphide InP, etc. The semiconductor memory may be divided into a volatile memory device and a non-volatile memory device.

Volatile memory devices may include memory devices where stored data becomes lost if a power is not supplied. The volatile memory devices may include a static RAM SRAM, a dynamic RAM DRAM, a synchronous DRAM SDRAM and so on. Non-volatile memory devices may include memory devices where stored data remains though a power is not supplied. The non-volatile memory devices may include a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. Flash memory devices may include NOR-type memory devices and NAND-type memory devices.

It would be advantageous to have improved semiconductor memory devices with a higher data reliability.

SUMMARY OF THE INVENTION

Exemplary embodiments of the present invention provide a semiconductor memory device for enhancing retention characteristics of data in a memory cell through a refresh operation and a method of operating the same.

A method of operating a semiconductor memory device according to one embodiment includes reading data stored in memory cells of a page; performing an error correction loop (ECC loop) including performing an error checking and correcting operation (ECC) on the read data; determining a number of bit errors in the read data; and when the number of bit errors is greater than a maximum number of correctable bits, incrementing the number of ECC iterations (ECC count) and increasing the maximum number of correctable bits; storing the ECC count until the number of bit errors is less than the maximum number of correctable bits; and programming corrected data to the memory cells when the stored ECC count is more than preset number.

A method of operating a semiconductor memory device according to another embodiment includes (a) reading data stored in memory cells of a first page of N pages, N being integer; (b) performing an error correction loop (ECC loop) including performing an error checking and correcting operation (ECC) on the read data; determining a number of bit errors in the read data; and when the number of bit errors is greater than a maximum number of correctable bits, incrementing the number of ECC iterations (ECC count) and increasing the maximum number of correctable bits; (c) storing the ECC count until the number of bit errors is less than the maximum number of correctable bits; and (d) performing the steps (a) to (c) on a second to an Nth pages of the N pages.

A method of operating a semiconductor memory device according to still another embodiment includes reading data stored in memory cells of a page; performing an error correction loop (ECC loop) including performing an error checking and correcting operation (ECC) on the read data; determining a number of bit errors in the read data; and when the number of bit errors is greater than a maximum number of correctable bits increasing the maximum number of correctable bits; and programming corrected data to the memory cells of the page when the number of bit errors is less than the maximum number of correctable bits.

A semiconductor memory device according to still another embodiment includes a memory array including memory cells; a write/read circuit configured to read data from the memory cells; and an ECC controller configured to perform an error checking and correcting operation (ECC) on the data read from the memory cells of a page by the write/read circuit. The write/read circuit is further configured to program corrected data to the memory cells.

A semiconductor memory device according to still another embodiment includes a memory array including memory cells; a write/read circuit configured to read data from the memory cells or program data to the memory cells; and an ECC controller configured to control the write/read circuit to program corrected data to memory cells of a page when a number of bit errors of the data read from the memory cells is less than a maximum number of correctable bits. The error correction loop performs a first error checking and correcting (ECC) on the read data and performs a second ECC on the read data when the number of bit errors exceeds a first maximum number of correctable bits, a second maximum number of correctable bits of the second ECC is greater than the first maximum number of correctable bits.

According to some embodiments, a semiconductor memory device of the present invention may enhance retention characteristics of data in a memory cell through a refresh operation. In addition, the semiconductor memory device may reduce adverse effects of the memory cell due to an increase in the number of program/erase operations.

According to some embodiments, a semiconductor memory device may perform the refresh operation in the unit of a page not a block, and so the refresh operation may be performed on a minimum number of memory cells. As a result, a duration for the refresh operation may be reduced, and thus the semiconductor memory device may obtain a threshold voltage distribution better than a threshold voltage distribution at an initial stage of operation of the semiconductor memory device.

According to some embodiments, the refresh operation may be applied to memory devices, including memory devices found in laptops, PDAs, portable electronic equipment such as portable phones, etc., computer bios, printers, USB storage devices, and so on.

BRIEF DESCRIPTION OF THE DRAWINGS

The above and other features and advantages of the present invention will become readily apparent by reference to the following detailed description when considered in conjunction with the accompanying drawings wherein:

FIG. 4 to FIG. 7 are flowcharts illustrating operation of a semiconductor memory device according to some embodiments.

DETAILED DESCRIPTION

Hereinafter, embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1A:
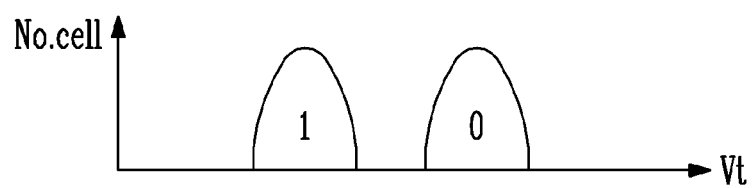
FIGS. 1A and 1B are views illustrating retention characteristics of data stored in a memory cell of a semiconductor memory device according to some embodiments.

FIG. 1A is a view illustrating retention characteristics of data stored in a memory cell of a semiconductor memory device according to some embodiments.

Generally, a threshold voltage of a memory cell may increase by performing a program operation so as to store data in the memory cell. As shown in FIG. 1A, a data value of '0' may be stored in the memory cell when the threshold voltage increases as a result of the program operation. A data value of '1' may be stored in the memory cell when the threshold voltage does not increase.

When a high voltage is supplied to a control gate of the memory cell during the program operation, electrons are injected into a floating gate of the memory cell through Fowler-Nordheim (FN) tunneling, and may increase the threshold voltage of the memory cell.

However, some of the electrons may be discharged from the floating gate of the memory cell over time. As a result, the threshold voltage of the memory cell may get lower, and thus a threshold voltage distribution of the memory cells becomes wider.

Figure 1B:
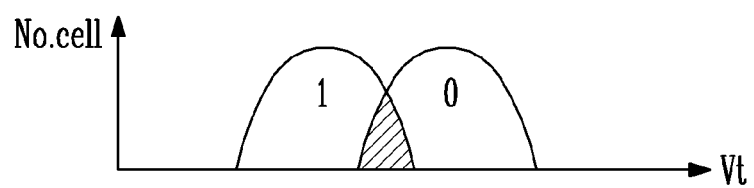

In this case, the threshold voltage distribution of programmed memory cells and the threshold voltage distribution of memory cells not programmed may become overlapped as shown in FIG. 1B.

Accordingly, it may be much more likely that incorrect data is read in a read operation.

Figure 2:
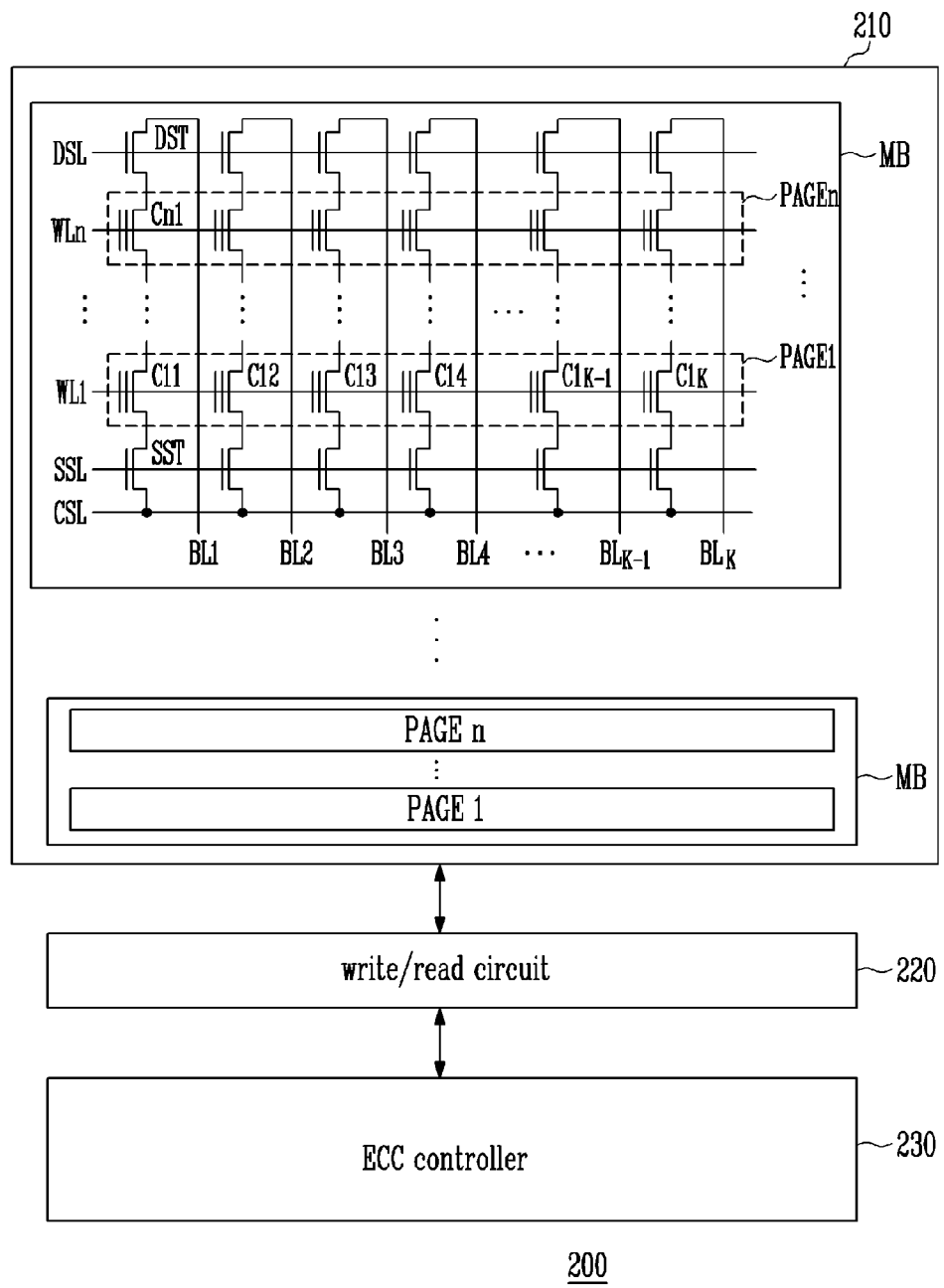
FIG. 2 is a block diagram illustrating a semiconductor memory device according to some embodiments.

FIG. 2 is a block diagram illustrating a semiconductor memory device 200 according to some embodiments.

As shown in FIG. 2, a semiconductor memory device 200 may include a memory array 210 having memory blocks MB, a write/read circuit 220 for performing a program operation and a read operation of memory cells in a page selected from the memory block MB, and an error checking and correcting (ECC) controller 230 for performing ECC and controlling the write/read circuit 220. In some embodiments, the write/read circuit 220 of a NAND flash memory device may include a voltage supply circuit, a page buffer group, a column select circuit, an input/output circuit (not shown), etc.

The memory array 210 may include memory blocks MB.

Each of the memory blocks MB may include strings coupled between bit lines BL1-BLk and a common source line CSL. That is, the strings may be coupled to corresponding bit lines BL1-BLk, and the strings may be coupled in common to the common source line CSL. Each of the strings, such as a first string, may include a source select transistor SST, memory cells C11-Cn1, and a drain select transistor DST. A source of the source select transistor SST may be coupled to the common source line CSL, and a drain of the drain select transistor DST may be coupled to a corresponding bit line BL. The memory cells C11-Cn1 may be coupled in series between the select transistors SST and DST. A gate of the source select transistor SST may be coupled to a source select line SSL, gates of the memory cells C11-Cn1 may be coupled to word lines WL1-WLn, and a gate of the drain select transistor DST may be coupled to a drain select line DSL.

Memory cells included in the memory block of the NAND flash memory device may be separated into pages. In some examples, memory cells C11-C1k may be coupled to one word line, e.g. WL1 and form a first page PAGE1. The page may be a reference unit of a program operation or a read operation. The memory cells C11-C1k forming the first page PAGE1 may be divided into common memory cells, spare cells, and flag cells. The common memory cells may be memory cells used for storing data, and the spare cells and flag cells may be memory cells used for storing state information of the semiconductor memory device, etc.

The write/read circuit 220 may perform the read operation of reading data from the memory cells or perform the program operation of storing data in the memory cells. Because the read operation and the program operation performed by the write/read circuit 220 may be substantially similar to a read operation and a program operation of other semiconductor memory devices, especially a read operation and a program operation of a non-volatile memory device, their detail description will be omitted.

The ECC controller 230 may repetitively perform an error correction operation on data read from memory cells of the first page PAGE1 by the write/read circuit 220. More particularly, the ECC controller 230 may perform a first error checking and correcting operation (first ECC) using a first number of bits as a maximum number of correctable bits. Because it may be impossible to correct errors when the number of bit errors exceeds the first number of bits, the ECC controller 230 may perform a second ECC using a second number of bits, higher than the first number of bits, as the maximum number of correctable bits. The ECC controller 230 may also store a count of the number of times the ECC is performed (ECC count) until the number of bit errors in the data is less than the maximum number of correctable bits.

The ECC controller 230 may control the write/read circuit 220 to program corrected data to the memory cells of the first page PAGE1 when the stored ECC count exceeds a maximum ECC count. Accordingly, because the write/read circuit 220 may again program the corrected data to the corresponding page, as controlled by the ECC, when the threshold voltage of the memory cell gets lower over time, retention characteristics of data may be enhanced.

The ECC controller 230 may determine that a corresponding block is a bad block and exit the error correction operation when the ECC count reaches the maximum ECC count to prevent the ECC from endlessly repeating the error correction loop.

According to some embodiments, the ECC controller 230 may control the write/read circuit 220 to store the ECC count in a spare cell or a flag cell of the first page PAGE1, control the write/read circuit 220 to read the ECC count of the first page PAGE1 when a booting or a background operation is performed, and control the write/read circuit 220 to program the corrected data to memory cells of the first page PAGE1 when the ECC count of the first page PAGE1 exceeds the preset number.

The ECC controller 230 may control the write/read circuit 220 to program the corrected data to the memory cells of the first page when the number of bit errors is less than the maximum number of correctable bits, instead of storing the ECC count.

According to some embodiments, the ECC controller 230 may be a separate controller located outside the semiconductor memory device 200. That is, the memory array 210 and the write/read circuit 220 may be located inside the semiconductor memory device, and the ECC controller 230 may control operation of the semiconductor memory device 200 from outside the semiconductor memory device 200.

According to some embodiments, the ECC controller 230 may perform the read operation using first read voltages when the first ECC is performed, and perform the read operation using second read voltages when the second ECC is performed. The maximum number of correctable bits in the first ECC may be the first number of bits, and the maximum number of correctable bits in the second ECC may be the second number of bits, which is higher than the first number of bits. Voltages of the second read voltages may be greater than voltages of the first read voltages. This will be described in detail below.

FIG. 3 is a view illustrating error correction operations of the ECC controller 230 in FIG. 2 according to some embodiments.

According to some embodiments, the maximum number of correctable bits that may be corrected through the error correction operation may be specified.

As shown in FIG. 3, the ECC controller 230 in FIG. 2 may perform the ECC operation using a flexible ECC method so that the maximum number of correctable bits may be changed.

Figure 3A:
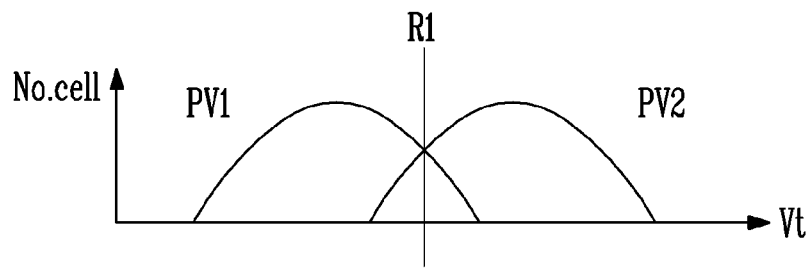
FIG. 3A to FIG. 3D are views illustrating error correction operations of the ECC controller in FIG. 2 according to some embodiments.

When a fixed ECC method is performed, data of memory cells in a page may be read based on one read voltage, e.g. a first read voltage R1 as shown in FIG. 3A and any bit errors may be corrected through an arithmetic operation. A duration of the fixed ECC method is short because only one read operation is performed, but the maximum number of correctable bits may be limited.

Figure 3B:
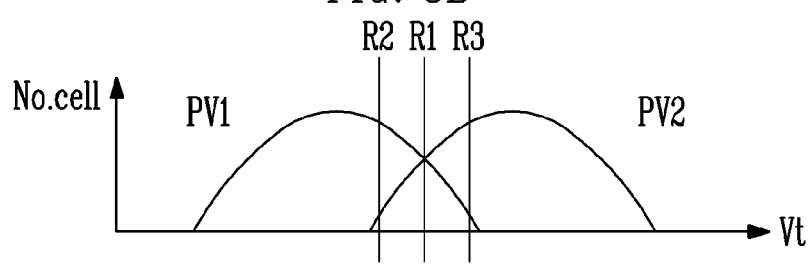

In some embodiments, when a 2-bit flexible ECC operation is performed, data of memory cells in a page may be read using a first read voltage R1 through a third read voltage R3 as shown in FIG. 3B and error bits may be corrected using a probability operation. A duration of the 2-bit flexible ECC operation may be longer because three read operations are performed, but the maximum number of correctable bits may be higher than in the fixed ECC operation.

Figure 3C:
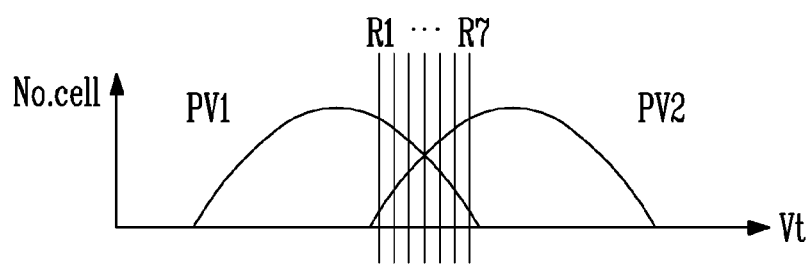

In some embodiments, when a 3-bit flexible ECC operation is performed, data of memory cells in a page may be read using a first read voltage R1 through a seventh read voltage R7 as shown in FIG. 3C and error bits may be corrected using a probability operation. A duration of the 3-bit flexible ECC operation may be even longer because seven read operations are performed, but the maximum number of correctable bits may be higher than in the 2-bit flexible ECC operation.

Figure 3D:
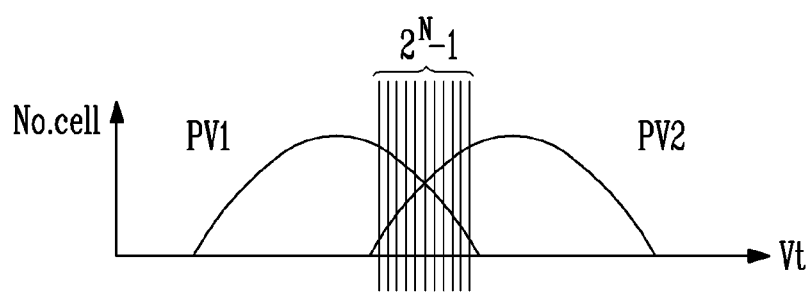

In some embodiments, when an N-bit flexible ECC operation is performed, data of memory cells in a first page may be read using a first read voltage through a $(2^N-1)$th read voltage as shown in FIG. 3D and bit errors may be corrected through a probability operation. Consequently, the flexible ECC operation may increase the maximum number of correctable bits. However, because the number of read operations may increase in order to augment the maximum number of correctable bits, a duration for the flexible ECC operation may increase correspondingly, and so a performance of the semiconductor memory device 200 may deteriorate. Accordingly, the flexible ECC algorithm should be properly used.

FIG. 4 to FIG. 7 are flowcharts illustrating operation of a semiconductor memory device according to some embodiments.

Figure 4:
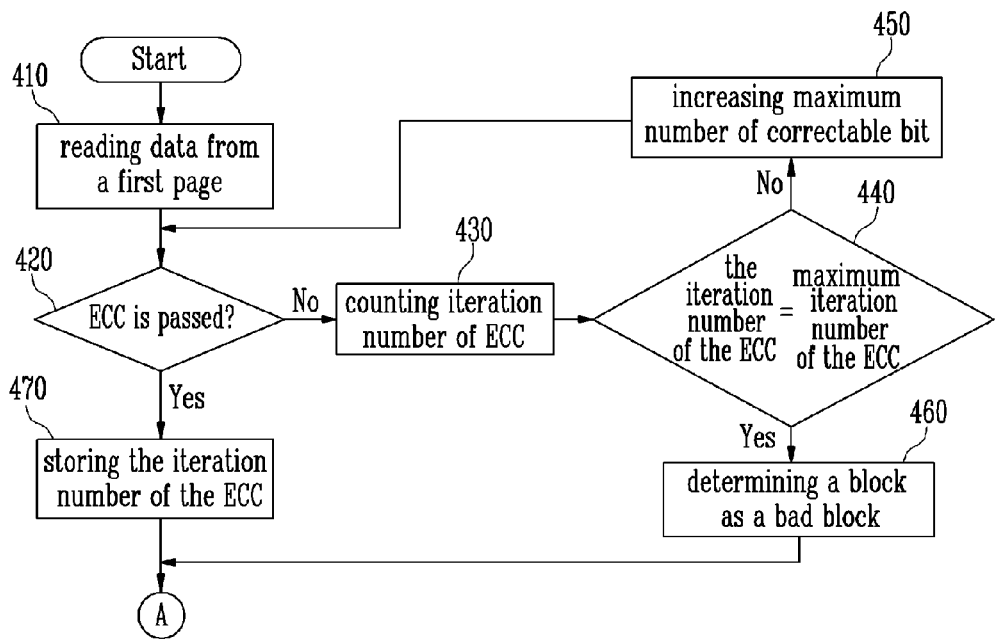

As shown in FIG. 4, a method of operating a semiconductor memory device according to some embodiments may read data stored in memory cells of a current page in step 410.

In steps 420, 430, 440 and 450, the method may perform an error correction loop (ECC loop) on the read data.

More particularly, in the step 420, the method may verify whether the ECC is passed by performing a first ECC using a first number of bits as the maximum number of correctable bits. The method may determine when the ECC has failed when the number of bit errors exceeds the first number of bits. When the ECC has failed, an ECC count may be incremented in the step 430 by adding one to the ECC count. In the step 440, the method may detect whether the ECC count reaches a maximum ECC count. In some embodiments, this may prevent the ECC loop from repeating endlessly. In some examples, the maximum ECC count may be configurable. In the step 460, when the ECC count reaches the maximum ECC count, the method may determine that a memory block is a bad block. In some examples, this may include the current page. The method may increase the maximum number of correctable bits to a second number of bits when the ECC count has not reached the maximum ECC count in the step 450. After the step 450, a second ECC on the current page may be performed using the second number of bits as the maximum number of correctable bits.

In some embodiments, the method may use the flexible ECC operation described in FIG. 3 to increase the maximum number of correctable bits. In some examples, the first ECC may perform the read operation using first read voltages, and the second ECC may perform the read operation using second read voltages, with a number of second read voltages being higher than a number of first read voltages.

In step 470, the method may store the ECC count when the number of bit errors is less than the maximum number of correctable bits. In some examples, when the number of bit errors is higher than the first number of bits and smaller than the second number of bits, the method may store the ECC count as 2 because two ECCs are performed.

Figure 5:
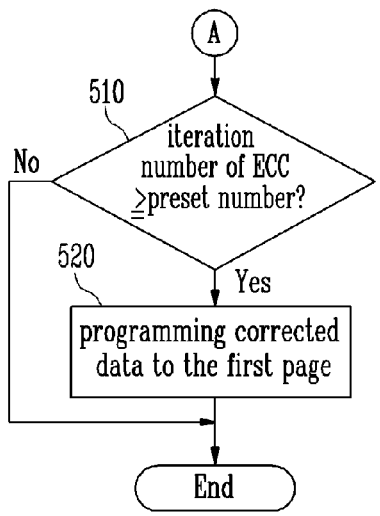

According to some embodiments, as shown in FIG. 5, the method may additionally verify whether the stored ECC count is greater than or equal to a preset number in step 510, and may program corrected data to the current page when the stored ECC count is greater than a preset number in step 520. The method may finish when the stored ECC count is smaller than the preset number because the data read does need not to be programmed again. The preset number may be set in advance by the ECC controller.

As described above, the method may repeat programming the corrected data to a corresponding memory cell based on the ECC count when the threshold voltage of the memory cell decreases over time after a corresponding program operation is performed on the memory cell, thereby enhancing retention characteristics of data.

Figure 6:
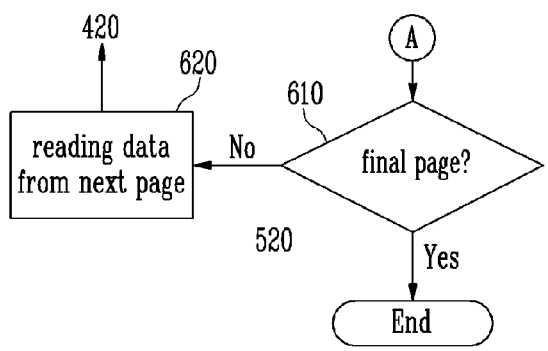

According to some embodiment, as shown in FIG. 6, the method may perform the ECC loop on the memory cells in the current page and store the ECC count in step 470, and verify whether the current page is a final page in step 610. The method may finish the ECC loop when the current page is the final page, and may read data in a next page when the current page is not the final page in step 620. After reading the next page, the ECC loop is performed again by returning to the step 420 with the next page becoming the current page.

According to some embodiments, the method may store the ECC count for each of the pages in the memory block during the ECC loop. As discussed above with respect to FIG. 2, the ECC count may be stored in the spare cell or the flag cell of the current page.

According to some embodiments, the stored ECC count may be read when a booting or a background operation is performed.

According to some embodiments, as shown in FIG. 7, an ECC method may read the ECC count of a first page by performing a read operation from a spare cell or a flag cell of the first page in step 710. The first page becomes the corresponding page.

The method may verify whether the ECC count is greater than or equal to a preset number in step 720, and program corrected data to the corresponding page when the ECC count is greater than or equal to the preset number in step 730.

The method may verify whether the corresponding page is a final page in step 740, and read the ECC count of a next page when the corresponding page is not the final page in step 750. The step 720 may be repeated with the next page becoming the corresponding page. The method may finish when the corresponding page is the final page.

The data does not to be programmed again when the ECC count is smaller than the present number, and thus the method may finish.

In some embodiments, the method may program the corrected data to memory cells in the corresponding page when the ECC count is greater than or equal to the preset number. Accordingly, retention characteristics of data may be enhanced.

According to some embodiments, as shown in FIG. 5 to FIG. 7, the ECC count may be stored and data may be programmed again when the ECC count is greater than or equal to the preset number. However, the ECC count may not be stored, and the corrected data may be programmed again to the memory cell when the number of bit errors is less than the maximum number of correctable bits.

Furthermore, some embodiments may increases the maximum number of correctable bits by performing several ECC operations using the flexible ECC operation. According to some embodiments, the disclosed methods may also be applied to a semiconductor memory device where only one ECC is performed. In some examples, the method may preset the maximum number of correctable bits to a threshold value, and program the corrected data to the corresponding page when the number of bit errors exceeds the threshold value when the ECC is performed. Thus, the method may program the corrected data to the corresponding page before the ECC fails for the corresponding page, thereby enhancing the retention characteristics of data.

Additionally, some embodiments may include non-transient, tangible machine-readable media that includes executable code that when run by one or more processors, may cause the one or more processors to perform the steps of methods described herein. Some common forms of machine readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, and/or any other medium from which a processor or computer is adapted to read.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of performing a refresh operation of a semiconductor memory device, the method comprising:
    reading data stored in memory cells of a page;
    performing an error correction loop (ECC loop) comprising:
    performing an error checking and correcting operation (ECC) on the read data;
    determining a number of bit errors in the read data; and
    when the number of bit errors is greater than a maximum number of correctable bits, incrementing an ECC count and changing the maximum number of correctable bits by increasing the maximum number of correctable bits, and repeating the ECC loop by performing the error checking and correcting operation using the changed maximum number of correctable bits;
    storing the ECC count when the number of bit errors in the read data is less than the maximum number of correctable bits as a result of performing the ECC; and
    programming corrected data to the memory cells when the stored ECC count is more than a preset number.

2. The method of claim 1 wherein performing the ECC on the read data includes using one or more read voltages and a number of the one or more read voltages increases with each time the ECC loop is performed.

3. The method of claim 1 wherein a block including the page is determined to be a bad block when the ECC count reaches a maximum ECC count.

4. The method of claim 1 wherein the ECC count is stored in a spare cell or a flag cell in the page.

5. A method of performing a refresh operation of a semiconductor memory device, the method comprising:
    (a) reading data stored in memory cells of a first page of N pages, N being an integer;
    (b) performing an error correction loop (ECC loop) comprising:
    performing an error checking and correcting operation (ECC) on the read data;
    determining a number of bit errors in the read data; and
    when the number of bit errors is greater than a maximum number of correctable bits, incrementing an ECC count and changing the maximum number of correctable bits by increasing the maximum number of correctable bits, and repeating the ECC loop by performing the error checking and correcting operation using the changed maximum number of correctable bits;
    (c) storing the ECC count when the number of bit errors in the read data is less than the maximum number of correctable bits as a result of performing the ECC;
    (d) performing the steps (a) to (c) on a second to an Nth pages of the N pages; and
    (e) programming corrected data to the memory cells when the stored ECC count is more than a preset number.

6. The method of claim 5 wherein performing the ECC on the read data includes using one or more read voltages and a number of the one or more read voltages increases with each time the ECC loop is performed on the first page.

7. The method of claim 5 wherein a block including the first page is determined to be a bad block when the ECC count reaches a maximum ECC count.

8. The method of claim 5 wherein the ECC count is stored in a spare cell or a flag cell in a corresponding page.

9. The method of claim 5 wherein:
each page of the N pages is associated with its own corresponding ECC count; and
the ECC count of each of the pages is read when a booting or a background operation is performed.

10. A method of performing a refresh operation of a semiconductor memory device, the method comprising:
reading data stored in memory cells of a page;
performing an error correction loop (ECC loop) comprising:
performing an error checking and correcting operation (ECC) on the read data;
determining a number of bit errors in the read data; and
when the number of bit errors is greater than a maximum number of correctable bits, incrementing an ECC count and repeating the ECC loop by increasing the maximum number of correctable bits; and
storing the ECC count and programming corrected data to the memory cells of the page when the number of bit errors is less than the maximum number of correctable bits.

11. The method of claim 10 wherein performing the ECC on the read data includes using one or more read voltages and a number of the one or more read voltages increases with each time the ECC loop is performed.

12. The method of claim 10 wherein:
a block including the page is determined to be a bad block when the ECC count reaches a maximum ECC count.

13. A semiconductor memory device comprising:
a memory array including memory cells;
a write/read circuit configured to read data from the memory cells; and
an ECC controller configured to perform an error checking and correcting operation (ECC) on the data read from the memory cells by the write/read circuit when a refresh operation is performed;
wherein the write/read circuit is configured to re-program the memory cells, from which the data is read, among the memory cells, with corrected data when the refresh operation is performed;
wherein the ECC controller is further configured to:
perform a first ECC in which a maximum number of correctable bits is a first number of bits;
perform a second ECC in which the maximum number of correctable bits is a second number of bits, the second number of bits being greater than the first number of bits;
count a number of ECGs using an ECC count; and
store the ECC count.

14. The semiconductor memory device of claim 13 wherein the ECC controller is further configured to:
perform a first read operation using first read voltages in the first ECC;
perform a second read operation using second read voltages in the second ECC; and
a number of the second read voltages is higher than a number of the first read voltages.

15. The semiconductor memory device of claim 13 wherein the ECC controller is further configured to repetitively perform the ECC until the number of bit errors is less than the maximum number of correctable bits.

16. The semiconductor memory device of claim 15 wherein the write/read circuit is further configured to program corrected data to the memory cells when the ECC count is greater than a preset number.

17. The semiconductor memory device of claim 15 wherein the ECC controller is further configured to determine that a memory block including the page is a bad block when the ECC count reaches a maximum ECC count.

18. The semiconductor memory device of claim 15 wherein the write/read circuit is further configured to store the ECC count in a spare cell or a flag cell of a first page.

19. The semiconductor memory device of claim 18 wherein the write/read circuit is further configured to read the ECC count of the first page when a booting or a background operation is performed.

20. The semiconductor memory device of claim 19 wherein the write/read circuit is further configured to program data corrected by the ECC controller to the memory cells when the ECC count of the first page is more than a preset number.

21. A semiconductor memory device comprising:
a memory array including memory cells;
a write/read circuit configured to read data from the memory cells or program data to the memory cells; and
an ECC controller configured to:
perform an error correction loop (ECC loop) by:
performing a first ECC, in which a maximum number of correctable bits is a first number of bits, on data read from memory cells of a first page by the write/read circuit, among the memory cells;
performing a second ECC in which the maximum number of correctable bits is a second number of bits, the second number of bits being greater than the first number of bits, when a number of bit errors exceeds the first number of bits when a refresh operation is performed;
counting both the first and second ECGs using an ECC count; and
storing the ECC count; and
control the write/read circuit to program the memory cells of the first page with corrected data when the number of bit errors of the data is less than the maximum number of correctable bits.

* * * * *